(12) United States Patent
Knotts

(10) Patent No.: US 6,335,955 B1
(45) Date of Patent: Jan. 1, 2002

(54) CONNECTION, SYSTEM AND METHOD OF PHASE DELAYED SYNCHRONIZATION IN HIGH SPEED DIGITAL SYSTEMS USING DELAY ELEMENTS

(75) Inventor: Brian W. Knotts, West Columbia, SC (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/221,863

(22) Filed: Dec. 29, 1998

(51) Int. Cl.[7] .................................................. H03L 7/00
(52) U.S. Cl. ........................ 375/354; 327/161; 327/252
(58) Field of Search ................................ 375/354, 356, 375/357, 371; 327/161, 237, 252, 276, 277, 283, 284, 290, 141

(56) References Cited

U.S. PATENT DOCUMENTS 4,021,740 A * 5/1977 Horna ............................ 32/29

6,157,231 A * 12/2000 Wasson ....................... 327/156

* cited by examiner

Primary Examiner—Amanda T. Le
(74) Attorney, Agent, or Firm—Antonelli, Terry, Stout & Kraus, LLP

(57) ABSTRACT

A phase delay arrangement for connecting high speed digital ICs, wherein a substantial majority of delay is provided via added passive delay elements. The phase synchronization delay arrangement (circuit connection, system and method) adds delay to the signal propagation path between a driving circuit 110 and receiving circuit 130, in order to match signal propagation between a transmitting/receiving circuit pair. Such phase synchronization delay arrangement is provided substantially by added passive components or devices, e.g., added signal line length, inductors, capacitors, which provide a majority or mainstay of the delay, but can further include single ones of flow-through latches, drivers, and programmable delay lines.

26 Claims, 5 Drawing Sheets

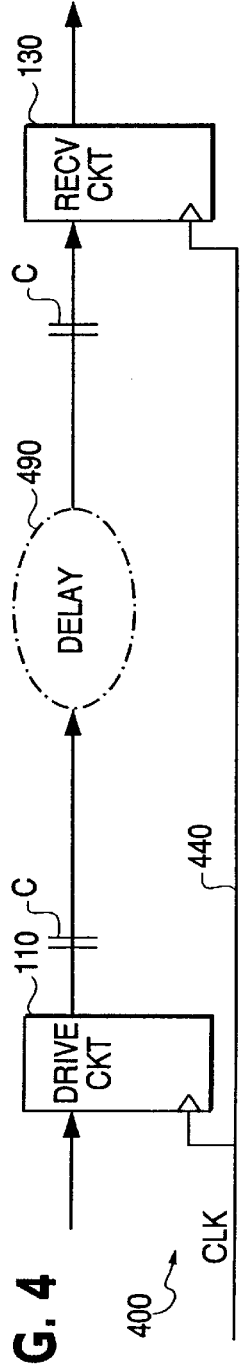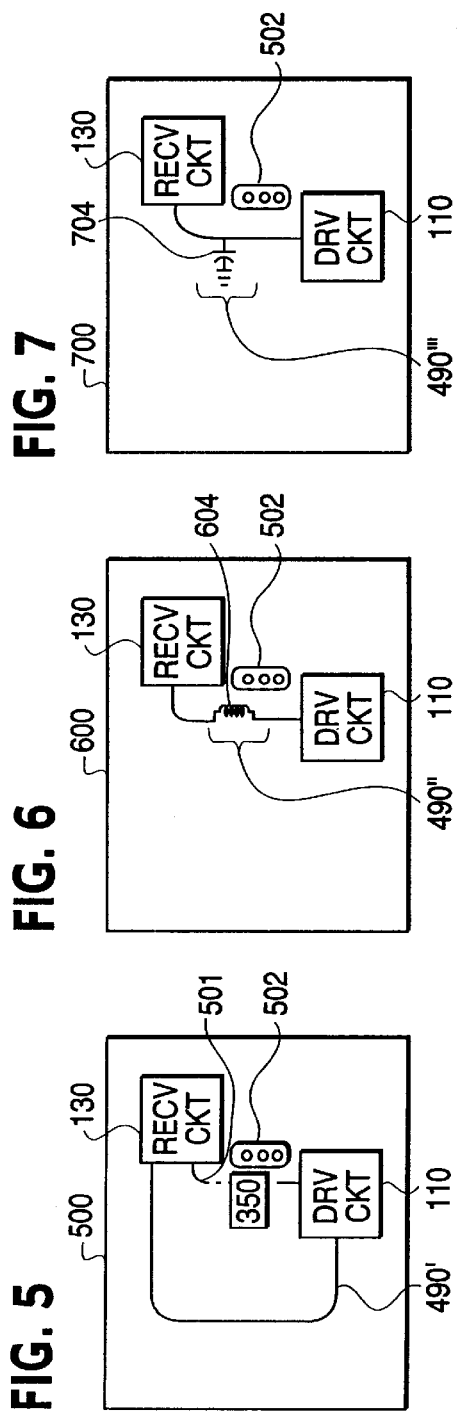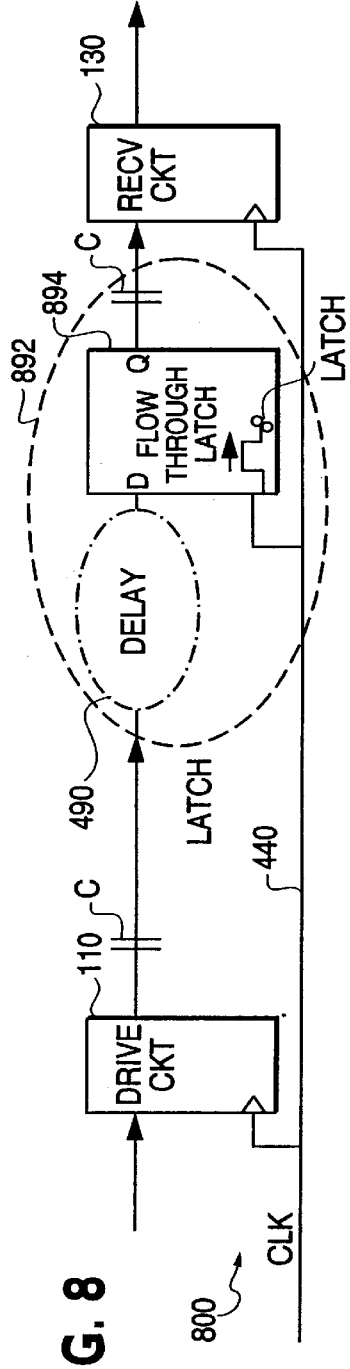

WRITE LATCH
TRUTH TABLE

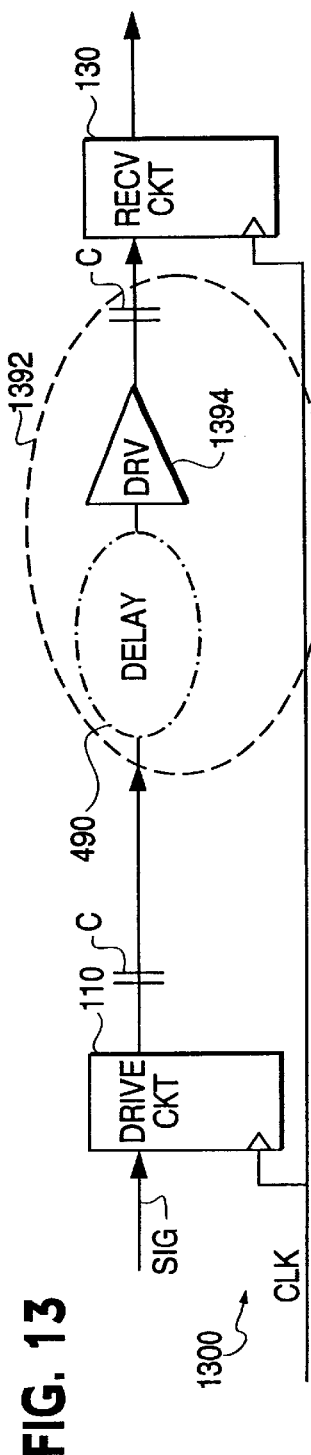
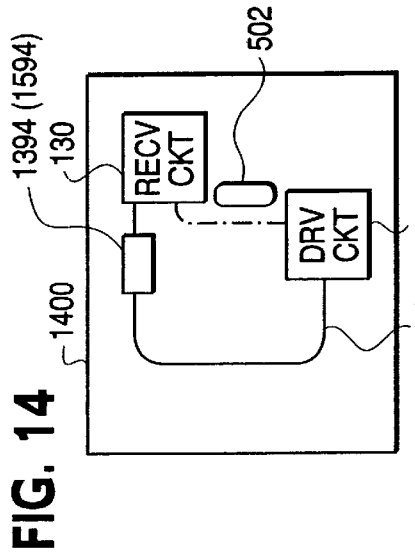
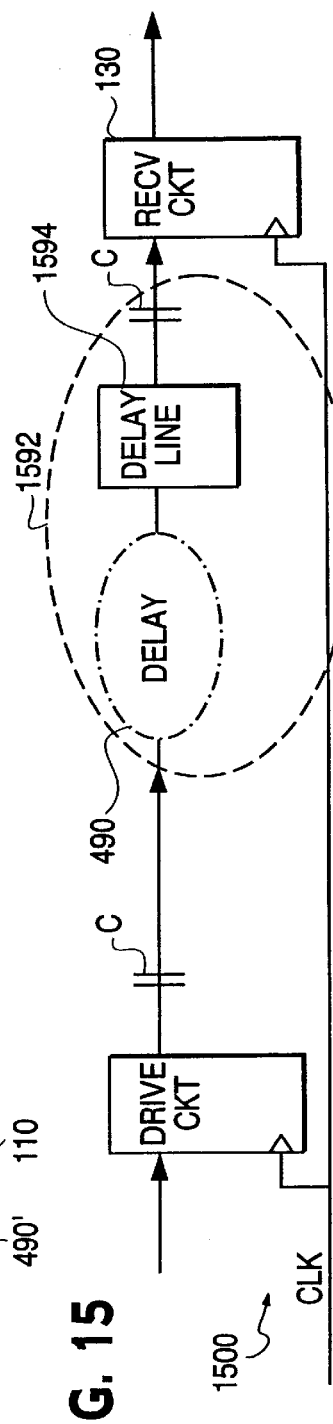
FIG. 13
FIG. 14
FIG. 15

CONNECTION, SYSTEM AND METHOD OF PHASE DELAYED SYNCHRONIZATION IN HIGH SPEED DIGITAL SYSTEMS USING DELAY ELEMENTS

TECHNICAL FIELD

The present invention generally relates to a connection, system and method of phase delayed synchronization in high speed digital systems using delay elements, and more particularly relates to a phase delay arrangement wherein a substantial majority of delay is provided via added passive delay elements.

BACKGROUND DISCUSSION

In FIG. 1, there is illustrated a high speed digital system 100 including a driving circuit 110 receiving a signal SIG and outputting a processed such signal to a receiving circuit 130 via an existing connection circuit 120 and connectors C, such driving circuit 110 and receiving circuit 130 being driven by a common clock signal CLK provided along a clock line 140. The driving circuit 110 and receiving circuit 130 can be any type of driving and receiving circuit. The components within the driving circuit 110 and receiving circuit 130 (e.g., both which may be implemented via IC chips) are manufactured to have sub-micron dimensions and micron spacings between such components, and accordingly, signal propagation time from one internal IC element to another internal IC element is substantially negligible. As a result, the internal IC circuits operate at extremely high speeds, e.g., server chips sets typically now operate with internal clock speeds of 100 MHz or faster. The present invention arises from the problem that external component spacings outside of the ICs (e.g., spacing between IC chips) are not matching the component spacings within ICs making it difficult if not impossible to manage synchronization with respect to downstream signals.

More particularly, in contrast to the internal environment of the ICs, in the FIG. 1 environment external to the ICs, there are physical limitations as to how closely spaced a driving circuit 110 and a receiving circuit 130 can be placed. More specifically, in this age of complex, highly dense systems having a plurality of interconnected printed circuit boards (PCBs) having several tens/hundreds of IC chips, a tremendous number of interconnection lines, numerous connectors and several hundreds/thousands of supporting components (e.g., resistors, capacitors, inductors, etc.), often a driving circuit 110 and a receiving circuit 130 are physically limited to be spaced at a substantial distance D (e.g., ten to fifteen inches) from one another. Resultant signal propagation along the substantial distance D, and especially through connectors C and any existing circuit 120 may cause a propagating signal not to meet a setup time of the receiving circuit 130, i.e., cause a synchronization mismatch between the driving/receiving circuits.

More specifically, assuming that the signal SIG is processed and output by the driving circuit 110 at a time t=0 (FIG. 2) coincident with a first clock pulse 242 of a 100 MHz (i.e., megahertz) clock having 10 ns (i.e., nanoseconds) clock periods, and does not arrive at the receiving circuit input until 13 ns later, such signal cannot be input into the receiving circuit 130 upon occurrence of the second clock pulse 244, i.e., it arrives too late at the receiving circuit. As a further problem, it is unlikely that such output signal will remain prevalent (i.e., valid) at an input to the receiving circuit 130 for another 6–7 nS so as to be available for capturing by the receiving circuit 130 upon occurrence of a third clock pulse 246. Accordingly, a window of availability of the propagated output signal at the receiving circuit 130's input does not match a predetermined setup time window required by the receiving circuit 130. A first method to deal with such signal propagation mismatch is to repeatedly rearrange IC's within a complex system (i.e., redesign) in an attempt to minimize IC-to-IC distances, but such method is limited because eventually physical spacing limitations are reached.

A second method of dealing with signal propagation mismatch is to utilize a multi-stage synchronous system such as that shown in FIG. 3 in order to synchronously control intermittent propagation timing of the output signal from the driving circuit 110 to the receiving circuit 130. More particularly, the FIG. 3 system 300 includes a multi-stage synchronous system 350 including a plurality of edge-triggered flip flops 360, 360+n (where n is an integer, e.g., 3–5), which flip flops 360, 360+n are clocked utilizing the common clock signal CLK along the clock signal line 140'. More specifically, the edge-triggered flip flops are utilized to control intermittent propagation of the output signal in its travel from the driving circuit 110 to the receiving circuit 130 so as to adjust a signal availability window at an input to the receiving circuit 130 to match an input timing requirement of the receiving circuit 130, i.e., to arrive at the input of the receiving circuit 130 at 19 nS which is immediately before the third clock pulse 246 occurring at 20 nS from the time t=0 as shown in FIG. 2. Accordingly, although the original propagated output signal cannot be available for the second clock pulse 244, such propagated output signal can be adjusted in time to be available for the third clock pulse 246.

The problems with the FIG. 3 multi-stage synchronous arrangement are numerous. More specifically, first, additional components are required to be added to the system 300, thus drastically increasing a crowding density and complexity of the system. For example, if there are 32 data bit output lines between a driving circuit 110 and a receiving circuit 130, and if two edge-triggered flip flops are required for each data line, then, 64 additional flip flops, clock lines and flip-flop power connections (Vcc and ground connections; not shown) would have to be provided between a single driving-circuit/receiving-circuit pair. If a compound number of driving/receiving circuit pairs exist within a system, a number of required additional components is compounded even more. Such numbers drastically increase a complexity of designing such a system 400, and often, multi-layered printed circuit boards (PCBc) are required to accommodate the tremendous number of conduction lines required. Further, since the flip-flops are active components, a power consumption and heat generation of the system is increased.

Both the redesigning approach and multi-stage synchronous arrangement represent a substantial time and money investment, and both degrade a time to market (TTM) introduction and availability new systems. As semiconductor manufacturing technology progresses to allow smaller and more closely spaced semiconductor elements within an integrated circuit (IC), the internal operating clock speeds of such ICs will continue to increase dramatically. As internal IC operating speeds become faster and faster, propagation problems caused by external spacing limitations will become more and more of a problem.

SUMMARY

The present invention is related to theory and method of phase delayed synchronization in high speed digital systems.

More particularly, the present invention relates to a circuit connection including: a phase delay synchronizer adapted to connect two digital circuits and provide phase delay synchronization between the digital circuits in order to make a propagating output signal from a transmitting one of the digital circuits meet a predetermined valid data input timing requirement of a receiving one of the digital circuits, wherein delay is provided substantially by at least one passive delay element.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure hereof this invention. While the foregoing and following written and illustrated disclosure focuses on disclosing example embodiments of the invention, it should be clearly understood that the same is by way of illustration and example only and is not to be taken by way of limitation, the spirit and scope of the present invention being limited only by the terms of the appended claims.

The following represents brief description of the drawings, wherein:

FIG. 4 is an example block diagram of a high speed digital system of the present invention, including an example phase synchronization delay arrangement of the present invention;

FIGS. 5–7 are example printed circuit board layouts of the FIG. 4 embodiment, including various example phase synchronization delay arrangements according to the present invention;

FIG. 8 is another example embodiment including another example alternative phase delay synchronization arrangement of the present invention;

FIG. 13 is another example embodiment including another example phase delay synchronization arrangement of the present invention;

FIG. 14 is an example printed circuit layout of the FIG. 13 and 15 embodiments; and FIG. 15 is another example embodiment having still another example phase synchronization delay arrangement of the present invention.

DETAILED DESCRIPTION

Figure 1:
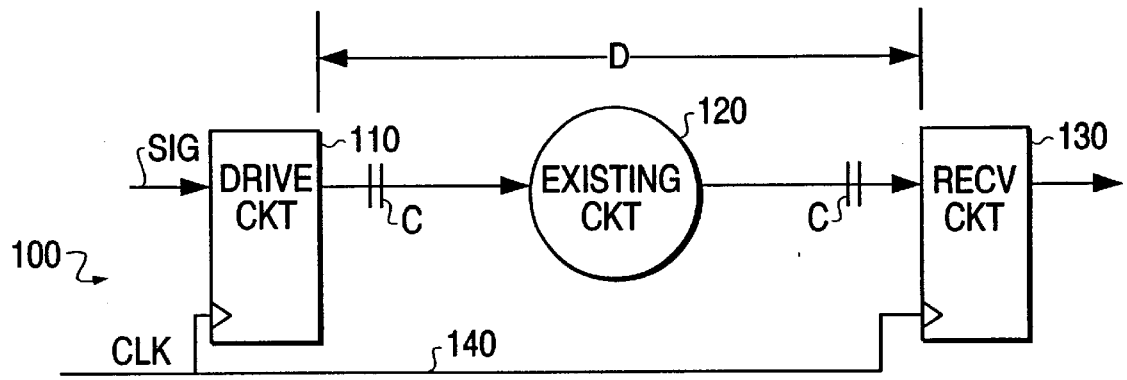
FIG. 1 is a block diagram illustration of a high speed digital system for background discussions.

Before beginning a detailed description of example embodiments of the subject invention, mention of the following is in order. When appropriate, like reference numerals and characters are used to designate identical, corresponding or similar components in differing figure drawings. Further, in the detailed description to follow, example sizes/models/values/ranges are given, although the present invention is not limited to the same. Still further, the clock and timing signal Figs. are not drawn to scale, and instead, example and critical time values are mentioned when appropriate. Finally, power connections to ICs and other components within the Figs. are not shown for simplicity of illustration and discussion.

Turning now to detailed description, FIG. 4 is a block diagram of an example high speed (e.g., greater than or equal to 100 Mz) digital system of the present invention, including the phase synchronization delay arrangement of the present invention. More particularly, shown is a system 400 including the similar components as FIG. 1, with an addition of a phase synchronization delay arrangement 490. That is, while a trend in the art was to attempt to minimize distances between ICs or use a multi-stage synchronous arrangement, the present invention takes an opposing approach of increasing an effective signal propagation distance between ICs, i.e., adds delay to the signal propagation path between the driving circuit 110 and receiving circuit 130 in order to provide phase delayed synchronization such that downstream signal management is improved. Without phase delayed synchronization, downstream signal management may not be possible due to difficult or impossible management of valid data input timing requirements such as setup and hold times. In a first example embodiment of the invention, such phase synchronization delay arrangement 490 may be provided substantially by added passive components or devices, e.g., added signal line length, inductors, capacitors.

Figure 3:
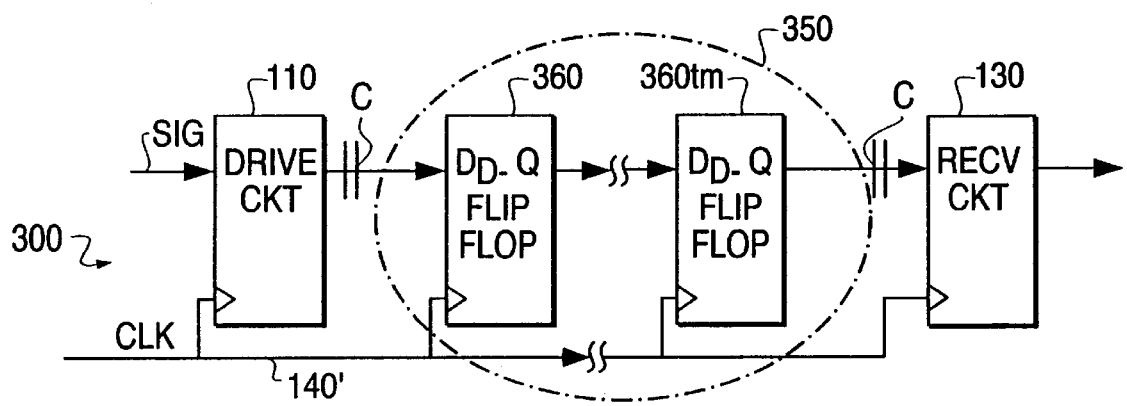
FIG. 3 is another example of a high speed digital system for background discussions.

More specifically, FIGS. 5–7 are example printed circuit board (PCB) layouts of the FIG. 4 embodiment, including example passive phase synchronization delay arrangements according to the present invention. The FIGS. 5–7 (and FIG. 14) example PCBs are shown in simplistic form for clarity of illustration; however, it should be understood that in actual practice such PCB would be a multi-PCB interconnected arrangement having an extremely complex system having a layout and components which dictate the closeness spacing between driving/receiving IC pairs. In FIG. 5, there is shown a PCB 500, including the IC driving circuit 110, the IC receiving circuit 130, a connector 502, and a phase delay synchronization arrangement 490'. The connector 502 is representative of a PCB component which intervenes and prevents the IC driving circuit 110 and IC receiving circuit 130 from being placed any closer together. Further illustrated in FIG. 5 for comparison purposes with the embodiment of the present invention, is an arrangement analogous to the FIG. 3 arrangement. More particularly, the phantom connection line 501 is illustrative of an example layout where a signal propagation path between the ICs is attempted to be minimized, taking into consideration intervening components such as the connector 502, and block 350 is a multi-stage synchronous system including a plurality of flip-flops. Such phantom connection line 501 and multi-stage synchronous system 350, however, is disadvantageous in that it results in a signal propagation delay synchronization mismatch and/or circuit complexity like that discussed above with respect to FIG. 1 or FIG. 3.

In contrast, the example phase delay synchronization or actual connection line 490' of the present invention goes against the trend of minimizing signal propagation paths, and instead adds propagation path (i.e., PCB conduction line) length so as to signal propagation match (phase delay synchronize) the IC driving circuit 110 and IC receiving circuit 130, i.e., adjusts signal propagation such that a signal arrival and availability of the signal at a receiving circuit input matches valid data timing input requirements of the receiving circuit. More particularly, adding of PCB conduction line length as a phase delay synchronization arrangement is advantageous in a number of regards.

First, there is no longer a need to minimize PCB spacing distances between driving/receiving circuit pairs, and accordingly, design of complex systems becomes easier as there is more freedom to move sending/receiving components apart to greater separation distances. Second, since there is a direct correlation between PCB conduction line length verses delay (e.g., 12 inches of PCB conduction line length ≈2 ns of phase synchronization delay), design of complex systems becomes further easier. Third, since great numbers of further components (such as the tremendous number of flip-flops of the FIG. 3 multi-stage synchronous arrangement) and their corresponding clock lines and power connection lines are avoided, the system is less complex and it is less likely that multi-layer PCBs will be required. Fourth, since the added PCB conduction line length used as a phase delay synchronization arrangement is a passive component itself requiring no separate power connection, clocking or switching connection, less power is used (in comparison to complex arrangements such as FIG. 3 utilizing a tremendous number of active devices or components).

With regard to the example configuration of the added PCB conduction line lengths as phase delay synchronization arrangements, several notes are in order. More particularly, straight PCB conduction lines may be preferred owing to ease of design and minimization of signal reflections at conduction line discontinuities (e.g., corners). Serpentine, curved, zig-zagged, etc. conduction lines are also acceptable. Further, care may be taken to maintain a minimum spacing (dictated by each particular system) between neighboring PCB conduction line lengths in order to minimize cross-talk and/or stray capacitances between lines.

Occasionally, there will be an implementation where adding of PCB conduction line length as a phase delay synchronization arrangement is not possible or desirable (e.g., due to extreme space limitations on the PCB). FIGS. 6 and 7 illustrate other example arrangements where inductors or capacitors can be used together with PCB conduction line length as a phase delay synchronization arrangement of the present invention. More specifically, FIG. 6 illustrates an example PCB 600 similar in construction and discussion to the FIG. 5 PCB 500, with the exception that an inductor 604 in series with conduction line length is utilized as a phase delay synchronization arrangement 490", i.e., the inductor/conduction-line series connection is appropriately selected in value/length to provide the necessary delay to match signal propagation timing between the driving/receiving circuit pair. Similarly, FIG. 7 illustrates an example PCB 700 similar in construction and discussion to the FIG. 5 PCB 500, with the exception that a capacitor 704 in parallel with a conduction line is utilized as a phase delay synchronization arrangement 490'", i.e., the capacitor/conduction-line parallel connection is appropriately selected in value/length to provide the necessary delay to match signal propagation timing (phase delay synchronization) between the driving/receiving circuit pair. While the FIGS. 6–7 arrangements provide the advantage of shorter conduction line length, such FIGS. 6–7 arrangements require additional time and manufacturing costs to add the additional inductors and capacitors to the PCBs. However, a low power advantage is maintained since all of the PCB conduction line lengths, inductors and capacitors used as a phase delay synchronization arrangement are passive components themselves requiring no separate power, clocking or switching connections.

FIG. 8 is another example embodiment including an alternative phase delay synchronization arrangement having a single flow-through latch. More specifically, FIG. 8 illustrates an example system 800 similar in construction and discussion to the FIG. 4 system 400, with the exception that an overall phase delay synchronization arrangement 892 includes not only a passive phase delay synchronization arrangement 490, but further includes a flow-through latch 894 receiving a common clock signal CLK along the clock line 440. The flow-through latch 894 is advantageous in that upon high levels of the clock signal CLK, a signal at a latch input terminal D is allowed to flow through to the latch output terminal Q, thus allowing the line between the latch 894 and receiving circuit 130 to immediately begin to precharge before latching. Upon occurrence of a low level of the clock signal CLK, the latch 894 latches and holds the signal at an output thereof.

Such arrangement is advantageous in that it eases design of the passive phase delay synchronization arrangement 490. More specifically, although the passive phase delay synchronization arrangement 490 provides a majority or mainstay of the phase delay synchronization, the latch 894 can allow some range of free-play in the exact amount of phase delay provided by passive phase delay synchronization arrangement 490. That is, without the latch 894, signal management is more difficult in that the passive phase delay synchronization arrangement 490 must be designed to provide necessary delay within a narrow range to match signal propagation timing between the driving/receiving circuit pair, i.e., must cause a window of availability of the propagated output signal at the receiving circuit 130's input to match a predetermined setup time window required by the receiving circuit 130. For example, referencing FIG. 2, without the latch 894, the passive phase delay synchronization arrangement 490 must be designed to cause the propagated output signal to arrive at the input to the receiving circuit 130 at substantially 19 ns. With the latch 894, signal management becomes easier in that the passive phase delay synchronization arrangement 490 can be more loosely designed to allow the propagated output signal to arrive earlier (e.g., at 17 ns) since the latch 894 will latch and hold such propagated output signal to effectively stretch a window of availability of the output signal at the receiving circuit 130's input.

As a second advantage, such latch 894 and its stretching of a window of availability of the output signal can be used to achieve long data holding to meet the timing requirements of receiving circuits requiring a long set-up time. Accordingly, signal management again becomes easier. As a third advantage, the latch 894 may act as a repeater to effectively renew the strength of any output signal which has propagated along a very long conduction line and undergone signal strength deterioration owing to inherent resistances and/or impedances along the long conduction line.

Figures 9, 10:
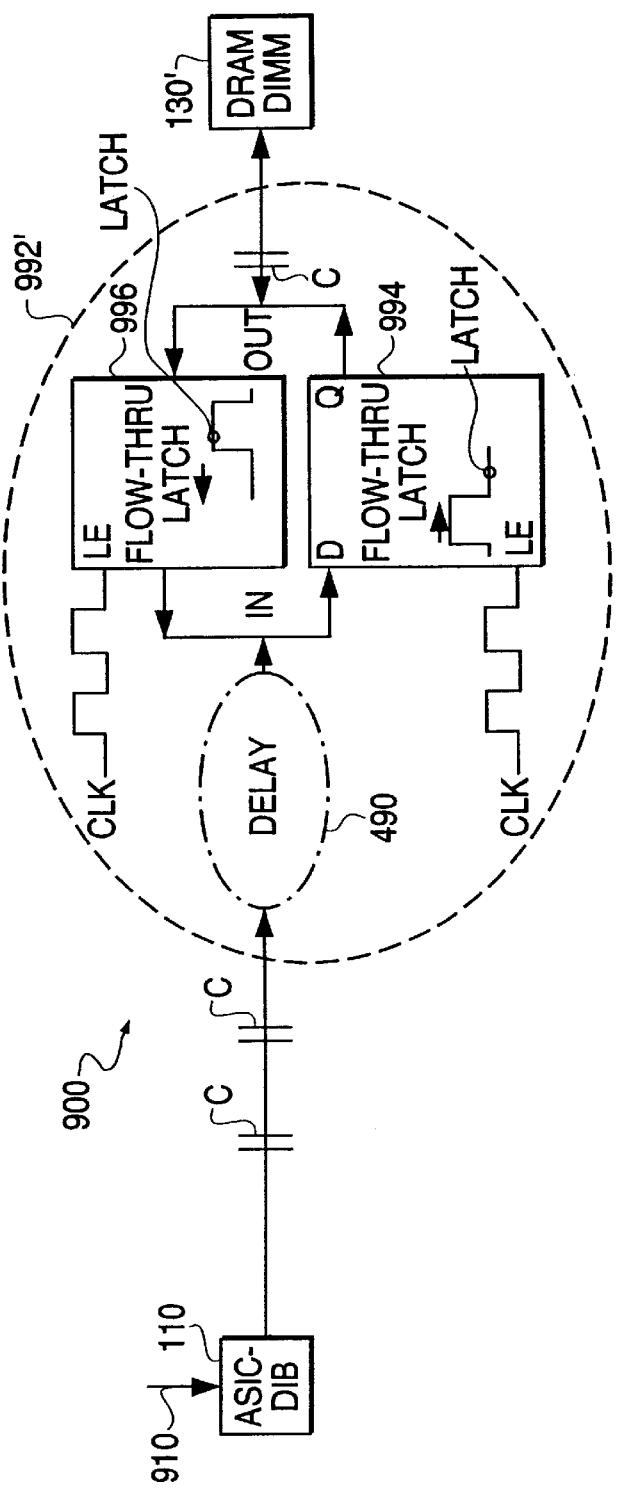
FIG. 9 is still another example embodiment having another example phase synchronization delay arrangement of the present invention.
FIG. 10 is an example truth table for an example write latch of FIG. 9.

FIG. 9 is another example embodiment including yet another example phase delay synchronization arrangement having dual opposing flow-through latches. More specifically, FIG. 9 illustrates a system 900 similar in construction and discussion to the FIG. 8 system 800, with several exceptions. First, the system 900 contains an example illustration of an application specific integrated circuit (ASIC) and/or data interface buffer (DIB) acting as both a transmitting/receiving circuit 110', and a dynamic random access memory (DRAM) or dual in-line memory module (DIMM) acting as both a receiving/transmitting circuit 130'. More specifically, the ASIC/DIB side of the latches 994, 996 may represent a system-side of the latches, whereas the DRAM/DIMM side may represent a memory-side of the latches. Second, an overall phase delay synchronization arrangement 992' may include not only a passive phase delay synchronization arrangement 490, but may further include an example flow-through write latch 994 and an example flow-through read latch 996, i.e., the system 900 transmits signals bi-directionally, with the latches 994 and 996 receiving a common clock signal CLK. The FIG. 9 flow-through write latch 994 may operate in the same manner as discussed for the FIG. 8 flow-through latch 894, with FIG. 10 representing an example truth table for such flow-through write latch 994.

More specifically, detailing FIG. 10, during a high level (i.e., "1") clock signal at a latch input terminal LE, whatever signal (e.g., "0" or "1") is present at the latch input (system-side) terminal D is allowed to propagate through to the latch output terminal Q of the flow-through write latch 994, throughout the high level (i.e., "1") clock signal. In contrast, upon occurrence of a low level (i.e., "0") clock signal at a latch input terminal LE, whatever signal (e.g., "D–") which was present at the latch input terminal D immediately prior to the low level (i.e., "0") clock signal is latched and held upon the latch output terminal Q throughout the low level (i.e., "0") clock signal. The FIG. 10 flow-through read latch 996 works in opposition to the FIG. 10 flow-through write latch 994, i.e., during a low level (i.e., "0") clock signal at a latch 996's input terminal LE, whatever signal (e.g., "0" or "1") is present at the latch input (i.e., memory-side) terminal D is allowed to propagate through to the latch output (i.e., system-side) terminal Q of the flow-through read latch 996, throughout the low level (i.e., "0") clock signal. In contrast, upon occurrence of a high level (i.e., "1") clock signal at a latch 996's input terminal LE, whatever signal (e.g., "D–") which was present at the latch input terminal D immediately prior to the high level (i.e., "1") clock signal is latched and held upon the latch output terminal Q throughout the high level (i.e., "1") clock signal.

Figure 11:
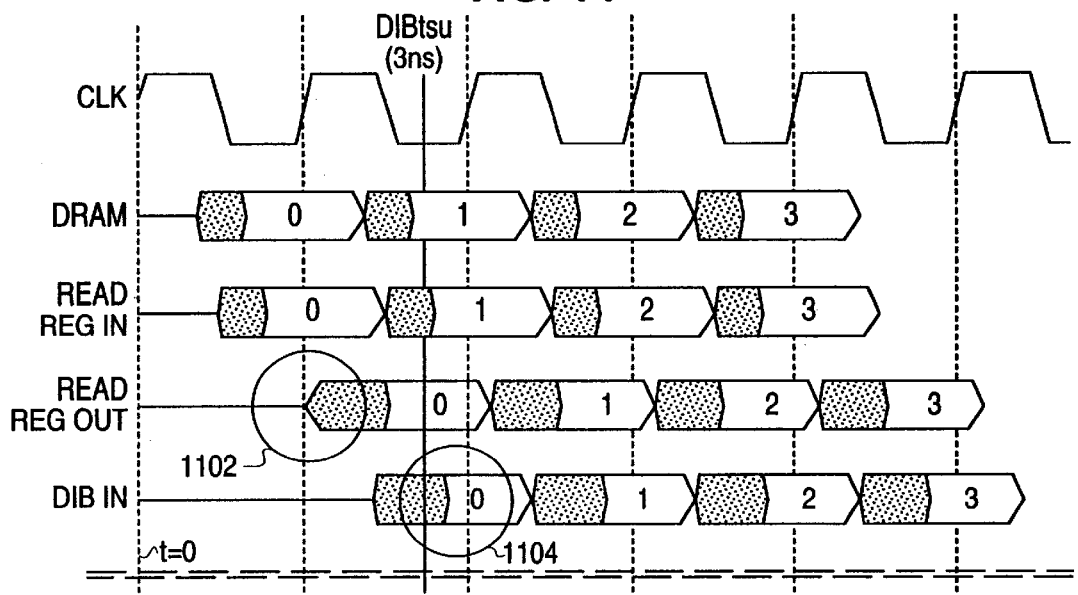
FIGS. 11–12 are example clock and signal timing diagrams used for explanation of the operation of the FIG. 9 latched embodiment and/or for comparison with a disadvantageous register arrangement.
Figure 12:
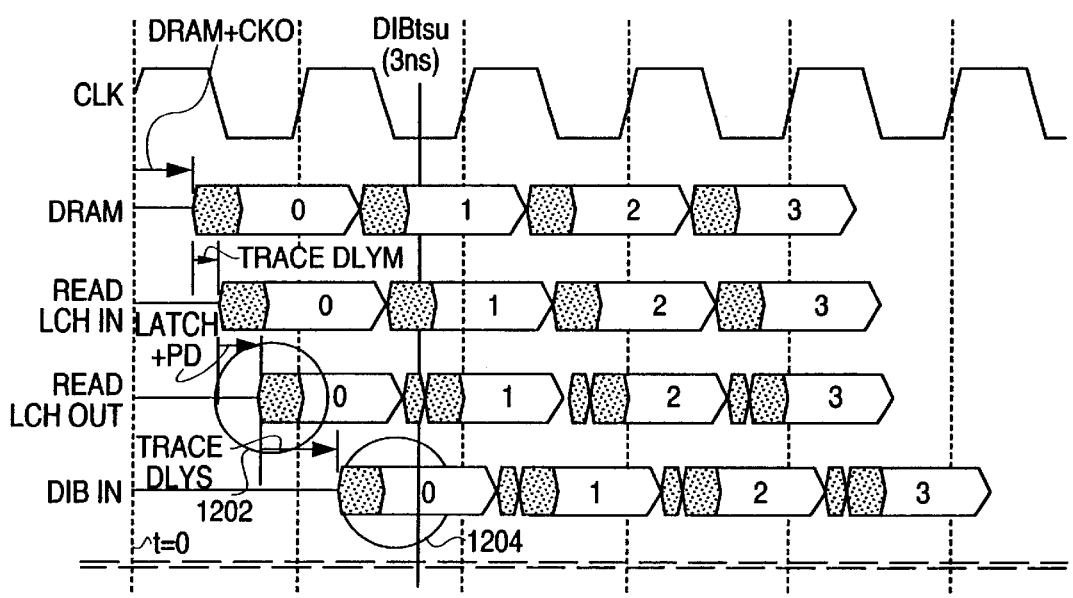

FIGS. 11–12 are example clock and signal timing diagrams used for explanation of a flow-through latched read operation of the FIG. 9 embodiment, and/or for comparison with a disadvantageous registered arrangement. More specifically, at a time t=0 (FIG. 12), the DRAM 130' begins a read out operation. After a short time designated by $DRAM_{tcko}$ (i.e., time to clock out) in FIG. 12, an initially indefinite and then settled data "0" appears onto the DRAM 130' output terminal. Such data "0" propagates along a trace conduction line to arrive at flow-through read latch 996's memory-side terminals after a time designated by TRACE DLY M (i.e., memory side trace delay). Since the common clock signal CLK is at a low level at such time, and because the flow-through read latch 996 provides data flow through the latch 996 during clock low levels, the data "0" propagates through the flow-through read latch 996, and appears at the latch 996's system-side terminals after a short time designated by $LATCH_{tpd}$ (i.e., time propagation delay). Such data "0" propagates along and begins precharging system-side trace conduction line to arrive at the DIB 110's input terminal after a time designated by TRACE DLY M (i.e., system side trace delay). Such data "0" thus is available and is inputted by the DIB 110' at the time indicated by the FIG. 12 vertical line designated $DIB_{tsu}$ (i.e., set-up time).

The use of a flow-through latch is one important and advantageous feature of this embodiment of the invention. More particularly, as mentioned earlier, by utilizing a flow-through latch, data is allowed to immediately flow through the latch so as to immediately begin to precharge the line onto which the data is outputted. Such early precharge is shown within the FIG. 12 circled area 1202. In comparison, if a registered (e.g., edge-triggered) arrangement were used instead to a flow-through latch, early precharging would not occur as can be seen by a comparison of the FIG. 11 (timing diagram for a registered arrangement) circled area 1102 with the FIG. 12 circled area 1202. Since the FIG. 11 registered arrangement outputs data "0" from the register later than FIG. 12's latch output data "0", such FIG. 11 output data "0" arrives at the DIB input terminals later that the FIG. 12 output data "0". Accordingly, by comparing the FIG. 11 circled area 1104 with the FIG. 12 circled area 1204, it can be seen that the FIG. 11 data "0" is not sufficiently stable to be inputted by the DIB 110' at the time indicated by the FIG. 11 vertical line designated $DIB_{tsu}$ (i.e., set-up time), whereas the FIG. 12 data "0" is. By the above, it can be seen that the flow-through latched embodiment is advantageous over a registered embodiment, in that quicker data output reads can be achieved. The FIG. 9's flow-through write latch 994 likewise facilitates early precharge and further discussion thereof is omitted for sake of brevity.

FIG. 13 is another example embodiment including an alternative phase delay synchronization arrangement having a driver. More specifically, FIG. 13 illustrates a system 1300 similar in construction and discussion to the FIG. 4 system 400, with the exception that an overall phase delay synchronization arrangement 1392 includes not only a passive phase delay synchronization arrangement 490, but further includes a driver 1394. The driver 1394 can advantageously act as a repeater to effectively renew the strength of any output signal which has propagated along a very long conduction line and undergone signal strength deterioration owing to inherent resistances and/or impedances along the long conduction line. Disadvantageously, the system 1300 increases manufacturing time, costs and complexity, in that further components, i.e., drivers, have to be added, and such components are active components requiring additional power/ground connections and power. While the driver 1394 does provide some delay, the passive phase delay synchronization arrangement 490 provides a majority or mainstay of the phase delay synchronization. FIG. 14 is an example printed circuit layout of the FIG. 13 embodiment (like that of FIG. 5), with the driver 1394 being illustrated as being provided via an IC package.

FIG. 15 is yet another example embodiment including an alternative phase delay synchronization arrangement having a programmable delay line IC. More specifically, FIG. 15 illustrates a system 1500 similar in construction and discussion to the FIG. 4 system 400, with the exception that an overall phase delay synchronization arrangement 1592 includes not only a passive phase delay synchronization arrangement 490, but further includes a programmable delay line IC 1594. The programmable delay line IC 1594 can advantageously ease design of the passive phase delay synchronization arrangement 490, by constructing the passive phase delay synchronization arrangement 490 to have any of a predetermined range of delay values (e.g., 13–19 ns), and then programmable using the delay line IC 1594 to minorly adjust the overall phase delay synchronization value. Such again is advantageous in easing design and signal managability. More specifically, although the passive phase delay synchronization arrangement 490 provides a majority or mainstay of the phase delay synchronization, the programmable delay line IC 1594 can allow some range of free-play in the exact amount of phase delay provided by passive phase delay synchronization arrangement 490.

Figure 2:
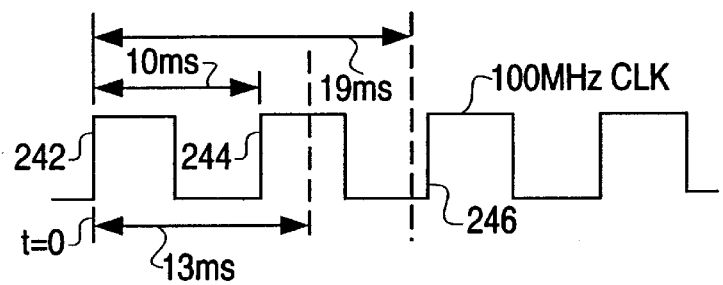
FIG. 2 is a clock signal waveform used for description of the FIG. 1 and FIG. 3 embodiments.

For example, with the FIG. 4 embodiment not having a programmable delay line IC 1694, the passive phase delay synchronization arrangement 490 may have to be precisely designed to cause the propagated output signal to arrive at the input to the receiving circuit 130 at substantially 19 ns (i.e., with the example timing diagram of FIG. 2). With the programmable delay line IC 1594, the passive phase delay synchronization arrangement 490 may be more loosely designed to allow the propagated output signal to arrive earlier (e.g., at 17 ns) since the programmable delay line IC can be programmed to provide a remaining amount of phase delay synchronization for driving/receiving circuit matching.

Disadvantageously, the system 1500 increases manufacturing time, costs and complexity, in that further components, i.e., programmable delay line ICs, have to be added, and then testing and programming of the delay line arrangements must be made. While the programmable delay line IC 1594 does provide some delay, the passive phase delay synchronization arrangement 490 provides a majority or mainstay of the phase delay synchronization. FIG. 14 can again be used as an example printed circuit layout of the FIG. 15 embodiment (like that of FIG. 13), with the programmable delay line IC 1594 being illustrated as being provided via the IC package.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A circuit connection comprising:
    a phase delay synchronizer adapted to connect two digital circuits and provide phase delay synchronization between said digital circuits in order to make a propagating output signal from a transmitting one of said digital circuits meet a predetermined valid data input timing requirement of a receiving one of said digital circuits, said phase delay synchronizer comprising a conduction line adapted to provide a majority of delay of said phase delay synchronizer.

2. A circuit connection as claimed in claim 1, wherein said delay is provided entirely by said conduction line.

3. A circuit connection comprising:
    a phase delay synchronizer adapted to connect two digital circuits and provide phase delay synchronization between said digital circuits in order to make a propagating output signal from a transmitting one of said digital circuits meet a predetermined valid data input timing requirement of a receiving one of said digital circuits, wherein delay is provided substantially by at least one passive delay element;
    wherein said phase delay synchronizer further includes a latch arrangement providing minority delay in comparison with said delay provided by said at least one passive delay element, said latch arrangement being adapted to performing at least one of: redriving a received signal in order to renew such signal; and, latching and outputting said signal for at least a predetermined time so as to meet a predetermined input timing requirement of a receiving digital circuit.

4. A circuit connection as claimed in claim 3, wherein said latch arrangement more specifically is a level-sensitive latch to normally allow said signal to propagate therethrough, and to latch and hold an outputting of said signal upon occurrence of a predetermined level.

5. A circuit connection as claimed in claim 4, wherein said level-sensitive latch arrangement normally allows said signal to propagate therethrough and to redrive said signal, in order to precharge a portion of said circuit connection receiving said signal during a time prior to the latching and holding of said signal.

6. A circuit connection comprising:
    a phase delay synchronizer adapted to connect two digital circuits and provide phase delay synchronization between said digital circuits in order to make a propagating output signal from a transmitting one of said digital circuits meet a predetermined valid data input timing requirement of a receiving one of said digital circuits, wherein delay is provided substantially by at least one passive delay element;
    wherein said phase delay synchronizer further includes a driver arrangement providing minority delay in comparison with said delay provided by said at least one passive delay element, said driver arrangement to red rive a received signal in order to renew such signal.

7. A circuit connection comprising:
    a phase delay synchronizer adapted to connect two digital circuits and provide phase delay synchronization between said digital circuits in order to make a propagating output signal from a transmitting one of said digital circuits meet a predetermined valid data input timing requirement of a receiving one of said digital circuits, wherein delay is provided substantially by at least one passive delay element;
    wherein said phase delay synchronizer further includes a programmable delay line providing minority delay in comparison with said delay provided by said at least one passive delay element, said delay line providing selectable adjustment of a total delay provided by said phase delay synchronizer via a plurality of selectable delays.

8. A circuit connection as claimed in claim 1, wherein said conduction line is more specifically a printed circuit trace line on a printed circuit board, and said phase delay synchronizer further comprises at least one of: an inductor in series with said printed circuit trace line to provide additional delay to said phase delay synchronizer; and a capacitor shunting said printed circuit trace line to provide additional delay to said phase delay synchronizer.

9. A circuit connection comprising:
    phase delay synchronizer means for connecting two digital circuits and for providing phase delay synchronization between said digital circuits in order to make a propagating output signal from a transmitting one of said digital circuits meet a predetermined valid data input timing requirement of a receiving one of said digital circuits, said phase delay synchronizer means comprising a conduction line means for providing a majority of delay of said phase delay synchronizer means.

10. A circuit connection as claimed in claim 9, wherein said delay is more specifically provided entirely by said conduction line means.

11. A circuit connection comprising:
  phase delay synchronizer means for connecting two digital circuits and for providing phase delay synchronization between said digital circuits in order to make a propagating output signal from a transmitting one of said digital circuits meet a predetermined valid data input timing requirement of a receiving one of said digital circuits, wherein delay is provided substantially by at least one passive delay elements means;
  wherein said phase delay synchronizer means further includes a latch means providing minority delay in comparison with said delay provided by said at least one passive delay element, said latch means for performing at least one of: redriving a received signal in order to renew such signal; and, latching and outputting said signal for at least a predetermined time so as to meet a predetermined input timing requirement of a receiving digital circuit.

12. A circuit connection as claimed in claim 11, wherein said latch means more specifically is a level-sensitive latch means for normally allowing said signal to propagate therethrough, and for latching and holding an outputting of said signal upon occurrence of a predetermined level.

13. A circuit connection as claimed in claim 12, wherein said level-sensitive latch means is more specifically for normally allowing said signal to propagate therethrough and to redrive said signal, in order to precharge a portion of said circuit connection receiving said signal during a time prior to the latching and holding of said signal.

14. A circuit connection comprising:
  phase delay synchronizer means for connecting two digital circuits and for providing phase delay synchronization between said digital circuits in order to make a propagating output signal from a transmitting one of said digital circuits meet a predetermined valid data input timing requirement of a receiving one of said digital circuits, wherein delay is provided substantially by at least one passive delay elements means;
  wherein said phase delay synchronizer means further includes a driver means for providing minority delay in comparison with said delay provided by said at least one passive delay element, said driver means for redriving a received signal in order to renew such signal.

15. A circuit connection comprising:
  phase delay synchronizer means for connecting two digital circuits and for providing phase delay synchronization between said digital circuits in order to make a propagating output signal from a transmitting one of said digital circuits meet a predetermined valid data input timing requirement of a receiving one of said digital circuits, wherein delay is provided substantially by at least one passive delay elements means;
  wherein said phase delay synchronizer means further includes a programmable delay line means for providing minority delay in comparison with said delay provided by said at least one passive delay element, said delay line means for providing selectable adjustment of a total delay provided by said phase delay synchronizer means via a plurality of selectable delays.

16. A circuit connection as claimed in claim 9, wherein said conduction line means is more specifically a printed circuit trace line on a printed circuit board, and said phase delay synchronizer means further comprises at least one of: an inductor in series with said printed circuit trace line to provide further delay to said phase delay synchronizer; and a capacitor shunting said printed circuit trace line to provide further delay to said phase delay synchronizer.

17. A digital system comprising:
  a first circuit adapted to operate as at least one of a transmitting circuit and a receiving circuit;
  a second circuit adapted to operate as at least one of a transmitting circuit and a receiving circuit; and,
  a phase delay synchronizer connection adapted to connect said first circuit and said second circuit and provide phase delay synchronization between said first circuit and said second circuit in order to make a propagating output signal from a transmitting one of said first and second circuits meet a predetermined valid data input timing requirement of a receiving one of said first and second circuits, said phase delay synchronizer comprising a conduction line to provide a majority of delay of said phase delay synchronizer.

18. A system as claimed in claim 17, wherein said delay is provided entirely by said conduction line.

19. A digital system comprising:
  a first circuit adapted to operate as at least one of a transmitting circuit and a receiving circuit;
  a second circuit adapted to operate as at least one of a transmitting circuit and a receiving circuit; and,
  a phase delay synchronizer connection adapted to connect said first circuit and said second circuit and provide phase delay synchronization between said first circuit and said second circuit in order to make a propagating output signal from a transmitting one of said first and second circuits meet a predetermined valid data input timing requirement of a receiving one of said first and second circuits, wherein delay is provided substantially by passive delay elements;
  wherein said phase delay synchronizer connection further includes a latch arrangement providing minority delay in comparison with said delay provided by said at least one passive delay element, said latch arrangement being adapted to perform at least one of: redriving a received signal in order to renew such signal; and, latching and outputting said signal for at least a predetermined time so as to meet a predetermined input timing requirement of a receiving digital circuit.

20. A system as claimed in claim 19, wherein said latch arrangement more specifically is a level-sensitive latch arrangement adapted to normally allow said signal to propagate therethrough, and to latch and hold an outputting of said signal upon occurrence of a predetermined level.

21. A system as claimed in claim 20, wherein said level-sensitive latch arrangement is more specifically adapted to normally allow said signal to propagate therethrough and to redrive said signal, in order to precharge a portion of said phase delay synchronizer connection receiving said signal during a time prior to the latching and holding of said signal.

22. A digital system comprising:
  a first circuit adapted to operate as at least one of a transmitting circuit and a receiving circuit;
  a second circuit adapted to operate as at least one of a transmitting circuit and a receiving circuit; and,
  a phase delay synchronizer connection adapted to connect said first circuit and said second circuit and provide phase delay synchronization between said first circuit and said second circuit in order to make a propagating output signal from a transmitting one of said first and second circuits meet a predetermined valid data input timing requirement of a receiving one of said first and second circuits, wherein delay is provided substantially by passive delay elements;

wherein said phase delay synchronizer connection further includes a driver arrangement providing minority delay in comparison with said delay provided by said at least one passive delay element, said driver arrangement being adapted to redrive a received signal in order to renew such signal.

23. A digital system comprising:

a first circuit adapted to operate as at least one of a transmitting circuit and a receiving circuit;

a second circuit adapted to operate as at least one of a transmitting circuit and a receiving circuit; and, a phase delay synchronizer connection adapted to connect said first circuit and said second circuit and provide phase delay synchronization between said first circuit and said second circuit in order to make a propagating output signal from a transmitting one of said first and second circuits meet a predetermined valid data input timing requirement of a receiving one of said first and second circuits, wherein delay is provided substantially by passive delay elements;

wherein said phase delay synchronizer connection further includes a programmable delay line providing minority delay in comparison with said delay provided by said at least one passive delay element, said delay line being adapted to provide selectable adjustment of a total delay provided by said phase delay synchronizer connection via a plurality of selectable delays.

24. A digital system comprising:

a first circuit adapted to operate as at least one of a transmitting circuit and a receiving circuit;

a second circuit adapted to operate as at least one of a transmitting circuit and a receiving circuit; and, a phase delay synchronizer connection adapted to connect said first circuit and said second circuit and provide phase delay synchronization between said first circuit and said second circuit in order to make a propagating output signal from a transmitting one of said first and second circuits meet a predetermined valid data input timing requirement of a receiving one of said first and second circuits, wherein delay is provided substantially by passive delay elements;

wherein said passive delay element is more specifically at least one of: a printed circuit trace line on a printed circuit board; an inductor in series with said printed circuit trace line; and, a capacitor shunting said printed circuit trace line.

25. A system as claimed in claim 17, wherein said first circuit and said second circuit are integrated circuits (ICs).

26. A method of connecting two digital circuits, said method comprising the steps of:

providing a first circuit adapted to operate as at least one of a transmitting circuit and a receiving circuit;

providing a second circuit adapted to operate as at least one of a transmitting circuit and a receiving circuit; and, adjusting a phase delay synchronization of a connection between said first circuit and said second circuit so as to match a phase delay timing of signals transmitted/received between said first circuit and said second circuit, said adjusting wherein delay is provided substantially by passive delay elements, said phase delay synchronizer comprising a conduction line to provide a majority of delay of said phase delay synchronizer.

* * * * *